(12) United States Patent
Iwanaga

(10) Patent No.: US 6,788,391 B2
(45) Date of Patent: Sep. 7, 2004

(54) ILLUMINATION DEVICE, EXPOSURE APPARATUS AND EXPOSURE METHOD

(75) Inventor: Takehiko Iwanaga, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 7 days.

(21) Appl. No.: 10/161,728

(22) Filed: Jun. 5, 2002

(65) Prior Publication Data

US 2003/0007137 A1 Jan. 9, 2003

(30) Foreign Application Priority Data

Jun. 13, 2001 (JP) .......................................... 2001-178438

(51) Int. Cl.⁷ .......................... G03B 27/72; G03B 27/42
(52) U.S. Cl. .......................................... 355/69; 355/53
(58) Field of Search .............................. 355/52, 53, 55, 355/67–71; 356/399–401; 200/548

(56) References Cited

U.S. PATENT DOCUMENTS

| 5,243,377 A | * | 9/1993 | Umatate et al. | 355/53 |
| 5,473,410 A | * | 12/1995 | Nishi | 355/53 |
| 5,483,311 A | * | 1/1996 | Sakakibara et al. | 355/53 |
| 5,491,534 A | | 2/1996 | Shiozawa | 355/69 |
| 5,534,970 A | * | 7/1996 | Nakashima et al. | 355/53 |
| 5,677,754 A | * | 10/1997 | Makinouchi | 355/53 |
| 5,699,148 A | | 12/1997 | Shiozawa | 355/71 |
| 6,552,774 B2 | * | 4/2003 | Hase et al. | 355/53 |
| 2003/0025890 A1 | * | 2/2003 | Nishinaga | 355/53 |

FOREIGN PATENT DOCUMENTS

| JP | 4-69660 | 3/1992 |
| JP | 6-349701 | 12/1994 |
| JP | 06349701 | * 12/1994 |
| JP | 7-74092 | 3/1995 |
| JP | 9-223662 | 8/1997 |

* cited by examiner

*Primary Examiner*—Henry Hung Nguyen
(74) *Attorney, Agent, or Firm*—Fitzpatrick, Cella, Harper & Scinto

(57) ABSTRACT

An illumination device for scanning exposure apparatus for carrying out exposure even when a movable stage is being accelerated and decelerated. The apparatus includes an illumination-distribution varying device for temporarily varying the illumination distribution of an illumination unit that is performing the exposure, wherein the illumination-distribution varying device has a function for varying the temporary change of the illumination distribution in conformity with a pattern for driving the movable stage.

32 Claims, 9 Drawing Sheets

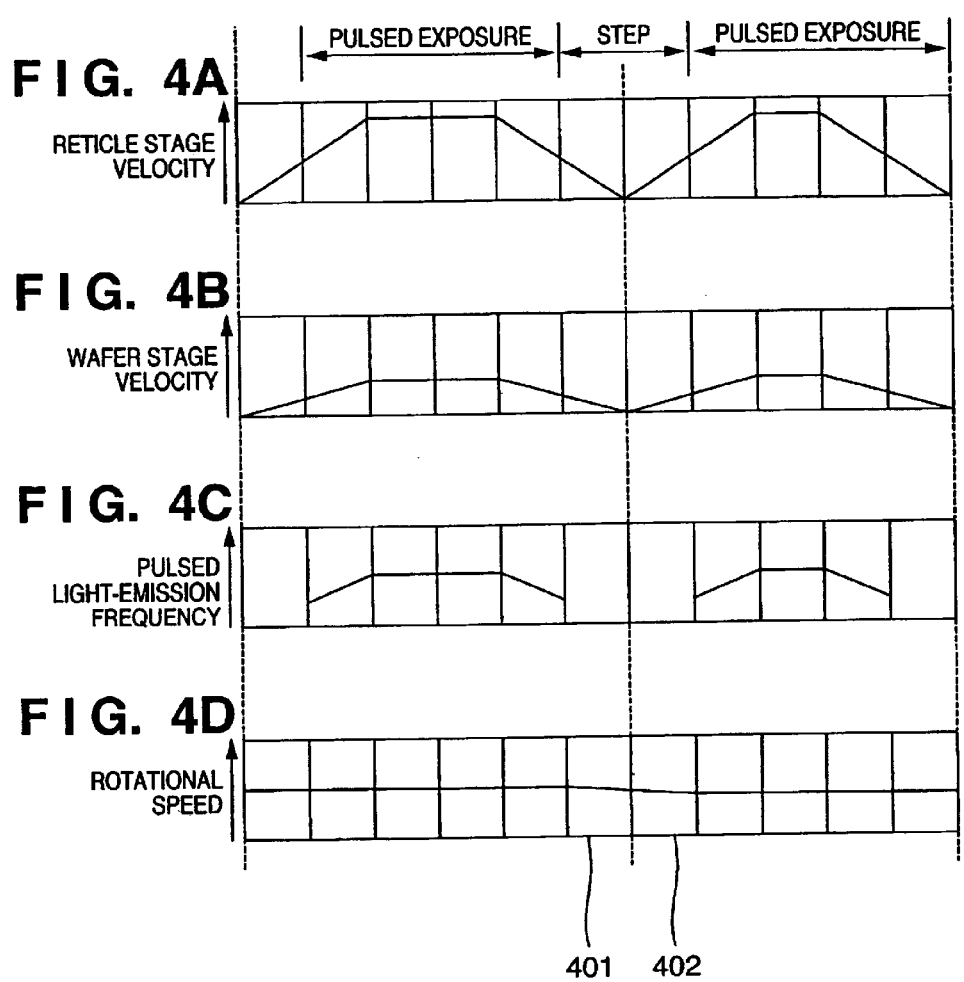

FIG. 7

```
URL  http://www.maintain.co.jp/db/input.html

MALFUNCTION DATABASE INPUT SCREEN

DATE OF OCCURRENCE [ 2000/3/15 ]~1404
MODEL [ ********* ]~1401
SUBJECT MATTER [ OPERATING MALFUNCTION (ERROR AT BOOTING) ]~1403
EQUIPMENT SERIAL NO. [ 465NS4580001 ]~1402
DEGREE OF URGENCY [ D ]~1405
CONDITION  [ LED CONTINUES FLASHING AFTER
             POWER IS TURNED ON           ]~1406

COUNTERMEASURE  [ POWER TURNED ON AGAIN
METHOD           (RED BUTTON PUSHED AT START UP) ]~1407

PROGRESS  [ TEMPORARY MEASURES COMPLETED ]~1408
REPORT

[SEND] [RESET]    1410              1411           1412
               LINK TO DATABASE OF RESULTS  SOFTWARE LIBRARY  OPERATING GUIDE
```

ILLUMINATION DEVICE, EXPOSURE APPARATUS AND EXPOSURE METHOD

FIELD OF THE INVENTION

This invention relates to an illumination device used in a scanning projection exposure apparatus, an exposure apparatus to which this illumination device is applied, and an exposure method for manufacturing semiconductor chips such as ICs and LSI circuits and devices such as liquid crystal elements, magnetic heads and CCDs, etc.

BACKGROUND OF THE INVENTION

The packing density of semiconductor devices such as ICs and LSI circuits is ever increasing and this has been accompanied by marked progress in techniques for micromachining semiconductor wafers. Examples of projection exposure apparatus at the center of such micromachining technology are a one to one (magnification I) projection exposure apparatus (mirror projection aligner), which performs exposure while scanning a mask and a photosensitive substrate with respect to a one to one magnification mirror having an arcuate exposure area, and a demagnifying projection exposure apparatus (stepper), which forms the pattern image of a mask on a photosensitive substrate by refraction optics and exposes the photosensitive substrate by a step-and-repeat method.

A step-and-scan scanning projection apparatus that provides a high resolving power and is capable of enlarging image size has recently been proposed. This scanning exposure apparatus uses short-wavelength light as the light source and emits the light in pulses. Various examples of these apparatus that seek to raise resolving power by using an excimer laser, for instance, have been proposed. In a scanning exposure apparatus that uses a pulsed light source to emit light in pulsed form, illumination is carried out uniformly so as to avoid non-uniform exposure while holding constant the amount of exposure on the illuminated surface. In order to achieve this, it is vital to establish an appropriate relationship between the pulsed light-emission timing or pulsed light-emission interval of the pulsed light source and the traveling velocity of the illuminated surface.

When scanning exposure is performed in the conventional scanning exposure apparatus, an acceleration period, which is the time required for a stage to reach a constant velocity starting from rest, and a deceleration period, which is the time required for the stage to come to rest starting from the constant velocity, are not used for the pulsed-light emission, and therefore these time periods represent wasted time as far as the overall time needed for the pulsed emission is concerned. As a consequence, the efficiency of the operation is poor and throughput declines. Further, in addition to a distance needed for a reticle stage and wafer stage to traverse the illumination area, distance for acceleration and deceleration also must be assured beforehand in the scanning zone. A problem which arises is a longer stroke necessary for the reticle and wafer stages. For this reason, the specification of Japanese Patent Application Laid-Open No. 9-223662 discloses a method of improving throughput. Specifically, when the surface to be illuminated is illuminated with pulsed light from a light source, the light source is made to emit pulsed light at a frequency proportional to the traveling velocity of the illuminated surface by emission control means, and exposure is carried out even during acceleration and deceleration of the stages, thereby improving throughput.

With a slit-scan exposure method, the reticle and substrate are scanned and therefore the phase at which a spectrum pattern appears varies with time. The direction in which the reticle and substrate are scanned, therefore, becomes a first problem. In a case where joint use is made of a rotating prism employed when a full-wafer exposure method is carried out, a second problem which arises is how to exercise control so as to rotate the prism in conformity with the scanning direction as well as the scanning velocities of the reticle and substrate. With the slit-scan exposure method, however, the phase at which a spectrum pattern appears varies with time owing to the scanning of the reticle and substrate. In order to avoid this, the specification of Japanese Patent Application Laid-Open No. 6-349701 discloses an example in which phase varying means is provided for varying, on a per-light-pulse basis, the phase of the spectrum pattern of pulsed light in the illumination area in accordance with the relative scanning velocity of the illumination area and mask and the relative pitch, in the scanning direction, of the spectrum of the pulsed light in the illumination area. In a case where exposure is carried out during stage acceleration and deceleration, as mentioned above, it is required that the rotating speed of the rotating prism be varied in conformity with the stage acceleration/deceleration pattern. However, since the rotating prism has a large inertia and is placed in the illuminating optical system, a small-size or hollow motor is used to drive the prism and this results in major space-related limitations. As a consequence, it is difficult to adjust angle of rotation in conformity with the stage acceleration/deceleration pattern.

SUMMARY OF THE INVENTION

The present invention has been proposed to solve the aforementioned problems of the prior art and its object is to provide an illumination device and a scanning exposure apparatus so adapted that when a surface to be illuminated is illuminated with pulsed light from a pulsed light source that emits the pulsed light, suitably sets pulse conditions, such as the pulsed light-emission timing or pulsed light-emission interval of pulses emitted from the pulsed light source, rotational speed of the rotating prism and travel conditions such as the traveling velocity and traveling distance of the illuminated surface, whereby the illuminated surface can be scanned and illuminated highly precisely without illumination non-uniformity (exposure non-uniformity) even in exposure during acceleration and deceleration, thus making it possible to manufacture semiconductor devices at a high throughput.

According to a first aspect of the present invention, the foregoing object is attained by providing an illumination device for a scanning exposure apparatus for carrying out exposure even when a movable stage is being accelerated and decelerated, comprising illumination-distribution varying means for temporarily varying the illumination distribution of an illumination unit that is for performing the exposure, wherein the illumination-distribution varying means has a function for varying the temporary change of the illumination distribution for conformity with a pattern for driving the movable stage.

As a result, a surface to be illuminated can be scanned and illuminated highly precisely without illumination non-uniformity (exposure non-uniformity) even in exposure during acceleration and deceleration. This makes it possible to manufacture semiconductor devices at a high throughput.

According to a second aspect of the present invention, the foregoing object is attained by providing an illumination device for a scanning exposure apparatus for carrying out exposure even when a movable stage is being accelerated and decelerated, comprising:

an optical member for temporarily varying the illumination distribution of an illumination unit that is for performing the exposure; and means for driving the optical member, wherein a pattern for driving the optical member is decided based upon results of measuring an illumination distribution that conforms to an acceleration/deceleration pattern of the stage.

As a result, a change in illumination distribution with time can be optimized in simple fashion.

According to a third aspect of the present invention, the driving pattern of the optical member may be fixed within a shot.

According to a fourth aspect of the present invention, the foregoing object is attained by providing an illumination device for a scanning exposure apparatus for carrying out exposure even when a movable stage is being accelerated and decelerated, comprising illumination-distribution varying means for temporarily varying the illumination distribution of an illumination unit that is for performing exposure, wherein the illumination-distribution varying means varies the illumination distribution of the illumination unit periodically irrespective of acceleration and deceleration of the stage.

In situations where exposure is performed during stage acceleration and deceleration, it is difficult to control the rotational speed of a wedge-shaped prism in sync with the stage acceleration/deceleration pattern. According to the present invention, therefore, an optimum fixed rotational speed is determined from the driving pattern of the stage. When exposure is carried out, it is performed in conformity with this rotational speed. As a result, exposure that is free of non-uniform illumination can be performed through a simple arrangement. In order to determine the rotational speed, the stage driving pattern is held fixed and non-uniform illumination is obtained using a sensor while varying the rotational speed. This makes it possible to decide the optimum rotational speed.

The present invention is also applicable to an exposure apparatus having any of the illumination devices described above, and to an exposure method that uses any of the illumination devices described above.

The present invention is also applicable to a method of manufacturing a semiconductor device comprising the steps of installing a group of manufacturing apparatus for performing various processes in a semiconductor manufacturing plant, and manufacturing a semiconductor device by performing a plurality of processes using the group of manufacturing apparatus, wherein the group of manufacturing apparatus includes the exposure apparatus described above. Preferably, the method of manufacturing a semiconductor device further comprises the steps of interconnecting the group of manufacturing apparatus by a local area network, and communicating information, which relates to at least one of the manufacturing apparatus in the group thereof, between the local area network and an external network outside the plant by data communication. Preferably, maintenance information for the manufacturing apparatus is obtained by accessing, by data communication via the external network, a database provided by a vendor or user of the exposure apparatus, or production management performed by data communication with a semiconductor manufacturing plant other than the first-mentioned semiconductor manufacturing plant via the external network.

Further, the present invention is applicable to a semiconductor manufacturing plant comprising: a group of manufacturing apparatus, for performing various processes, inclusive of the above-described exposure apparatus; a local-area network for interconnecting the group of manufacturing apparatus; and a gateway for making it possible to access, from the local-area network, an external network outside the plant; whereby information relating to at least one of the manufacturing apparatus in the group thereof can be communicated by data communication. The present invention is also applicable to a method of maintaining an exposure apparatus, comprising the steps of: providing a maintenance database, which is connected to an external network of the semiconductor manufacturing plant, by a vendor or user of the above-described exposure apparatus; allowing access to the maintenance database from within the semiconductor manufacturing plant via the external network; and transmitting maintenance information, which is stored in the maintenance database, to the side of the semiconductor manufacturing plant via the external network.

Further, the exposure apparatus according to the present invention may further comprise a display; a network interface; and a computer for running network software, wherein maintenance information relating to the exposure apparatus is communicated by data communication via a computer network. Preferably, the network software provides the display with a user interface for accessing a maintenance database, which is connected to an external network of a plant at which the exposure apparatus has been installed, and which is supplied by a vendor or user of the exposure apparatus, thereby making it possible to obtain information from the database via the external network.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate an embodiment of the invention and, together with the description, serve to explain the principles of the invention.

FIGS. 4A to 4D are explanatory views illustrating the relationship among traveling velocity of a reticle stage, traveling velocity of a wafer stage, pulsed light-emission frequency and rotational speed of a wedge prism;

FIG. 7 shows a specific example of a user interface;

DESCRIPTION OF THE PREFERRED EMBODIMENT

A preferred embodiment of the present invention will now be described in detail in accordance with the accompanying drawings.

Figure 1:
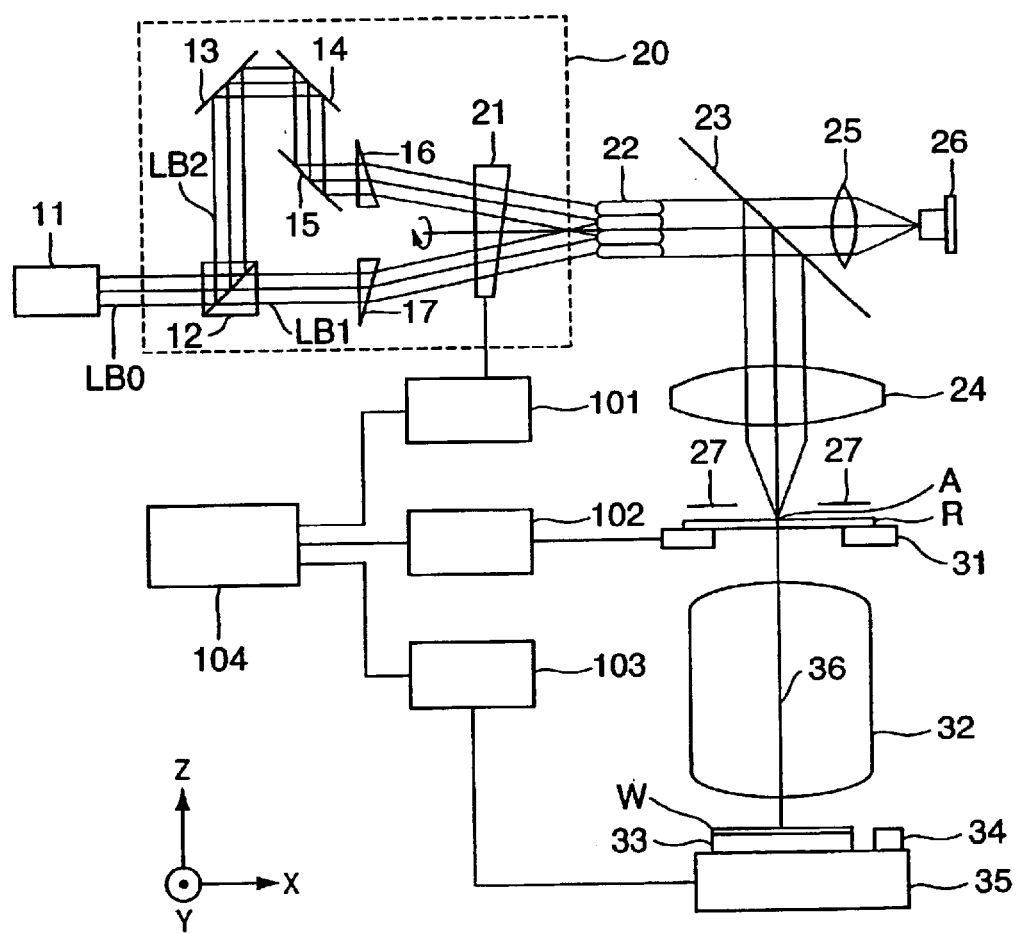
FIG. 1 is a schematic, structural view illustrating an example of a scanning exposure apparatus according to an embodiment of the present invention.

FIG. 1 is a schematic, structural view illustrating an example of a scanning projection exposure apparatus according to an embodiment of the present invention. This exposure apparatus is used when manufacturing a semiconductor device such as an IC or LSI circuit, a liquid crystal device, an imaging device such as a CCD and a device such as a magnetic head.

As shown in FIG. 1, the exposure apparatus includes a KrF excimer laser 11 having comparatively little spatial coherence; an incoherent optical system 20, which is for splitting light flux, having a rotatable wedge prism 21 serving as an optical member for temporarily varying an illumination distribution; an optical integrator 22 comprising a fly-eye lens or the like; a half-mirror 23 for bending the optical path and transmitting part of the light flux; a condenser lens 24 for condensing the light flux that has been reflected by the half-mirror 23; a condenser lens 25 for condensing the light flux that has passed through the half-mirror 23; and photoreceptor means 26, on which the condensed light from the condenser lens 25 impinges, for controlling the amount of exposure.

The apparatus further includes a visual-field stop 27 for limiting the illumination area of a reticle R. The shape of the stop 27 is changed by a driver mechanism, which is not shown. A circuit pattern has been drawn on the reticle R. The apparatus further includes a reticle stage 31 on which the reticle R is mounted for causing the reticle R to scan. A wafer W serves as a photosensitive substrate coated with a resist. The apparatus further includes a projection optical system 32 for projecting the circuit pattern of the reticle R onto the wafer W, a wafer chuck 33 for holding the wafer W, an illuminator photometer 34 for measuring illumination on the surface of the wafer W, and a wafer stage 35 on which the surface is W mounted. The wafer stage 35 is stepped in a plane perpendicular to an optical axis 36 to move an exposure area (shot) onto the optical axis 36. The wafer stage 35 drives the wafer W in the direction of the optical axis 36 based upon focal-point detection and scans the wafer W in sync with the reticle stage 31.

The apparatus further includes a prism driver 101 for controlling rotation of the wedge prism 21; a reticle stage controller 102 for controlling scanning of the reticle stage 31; a wafer stage controller 103 for controlling drive and scanning of the wafer stage 35; and a main controller 104 for sending the prism driver 101 commands to rotate and halt the wedge prism 21, and for controlling the reticle stage controller 102 and wafer stage controller 103 as well as the apparatus overall, the latter including management of various sequences, etc. With regard to control of exposure, voltage applied to the excimer laser 11 is decided by an exposure control system (not shown) based upon a signal from the photoreceptor means 26, and lasing of the excimer laser 11 is performed in response to a command from the main controller 104.

Parallel coherent laser light LB0 emitted from the excimer laser 11 is split into two light beams LB1 and LB2 by a half-mirror 12. The light beam LB1 that has passed through the half-mirror 12 advances toward a wedge prism 17, while the light beam LB2 that has been reflected by the half-mirror 12 is reflected successively by mirrors 13, 14, 15 so that its optical path is bent at right angles three times before it advances toward a wedge prism 16. The optical path of the light beam LB1 up to its arrival at the wedge prism 17 and the optical path of the light beam SB2 up to its arrival at the wedge prism 16 have lengths that differ from each other. The incoherent optical system 20 is constructed in such a manner that this difference in the optical paths of the light beams LB1 and LB2 will exceed the temporary coherence length of the laser light decided by the wavelength of the laser light produced by the excimer laser 11. As a result, there is almost no interference between the light beams LB1 and LB2 deflected by the wedge prisms 16 and 17 (the light beams are mutually incoherent) and no interference fringes are formed on the incidence plane of the optical integrator 22.

The light beams LB1, LB2 reflected by the wedge prisms 16, 17 impinge upon the wedge prism 21 as parallel light. The wedge prism 21 is rotatable about the optical axis 36 by the prism driver 101. If the wedge prism 21 is rotated, the angles and positions of incidence of the light beams LB1, LB2 on the plane of incidence of the optical integrator 22 vary with time. The light flux emitted from the optical integrator 22 is bent at right angles by the half-mirror 23 and is caused to illuminate a prescribed illumination area on the reticle R by the condenser lens 24. In the case of a scanning exposure apparatus, the illumination area has the shape of a slit whose width is small in the direction of scanning, as shown in FIG. 1.

The optical integrator 22 is constituted by a lens array in which lens elements are arrayed two-dimensionally in a plane perpendicular to the optic axis. The light beams LB1, LB2 have their wave fronts split by the optical integrator 22 so that a plurality of secondary light sources are formed. The light beams from these plurality of secondary light sources become superimposed on the reticle R and wafer W. Accordingly, though the light flux from the excimer laser 11 exhibits comparatively little spatial coherence, the light beams from the secondary light sources interfere with one another so that low-contrast interference fringes are formed on the reticle R and wafer W. In the optical system 20 according to this embodiment, the mutually incoherent light beams LB1, LB2 of split amplitudes are made to impinge upon the optical integrator 22 from different directions, as a result of which the phases of the low-contrast interference fringes produced by the light beams LB1, LB2 differ from each other. This has the effect of reducing further the contrast of the interference fringes, though the effects of the interference fringes cannot be eliminated entirely.

In a case where the reticle R and wafer W are caused to scan by synchronizing the reticle stage 31 and wafer stage 35 using the reticle stage controller 102 and wafer stage controller 103, respectively, the interference fringes in the illumination area move relatively in the scanning direction with respect to each position on the reticle R. As a consequence, the amount of exposure at a point A on the reticle R shown in FIG. 1 is obtained by integrating the illumination at the coordinates of point A along the X direction, which is the scanning direction, over the range of the illumination area. Even though low-contrast interference fringes remain, a uniform exposure distribution can be achieved in the exposure zone of the reticle R and wafer W owing to the averaging effect of scanning. The interference fringes on the reticle R and wafer W are formed as fringes that correspond to the array of lens elements in the optical integrator 22. In a case where the lens array is arranged longitudinally and transversely in a plane perpendicular to the optic axis 36, the interference fringes appear as transverse fringes of varying contrast based upon illumination non-uniformity of the kind shown in FIG. 2 along the Y axis. The reason for this is that the interference fringes (illumination distribution) is not averaged by scanning with regard to the Y direction, which is perpendicular to the scanning direction. Accordingly, the optical integrator 22 (the two-dimensional array of multiple light sources produced by the optical integrator 22) is rotated though an extremely small angle about the optic axis 36 to rotate the interference fringes on the reticle R and wafer W, as a result of which the interference fringes are averaged even in relation to the Y direction to obtain a uniform exposure distribution along both the X and Y directions. A system in which the optical integrator 22 is arranged in this fashion is disclosed in the specification of Japanese Patent Application Laid-Open No. 8-8168.

Consider a case where the reticle R and wafer W are exposed while at rest for the purpose of separating the influence of the scanning precision of the reticle stage 31 and wafer stage 35 on imaging performance and distortion from imaging performance and distortion ascribable to the projection optical system 32 itself. Since low-contrast interference fringes reside on the reticle R and wafer W, the pattern image is affected by non-uniform exposure due to the interference fringes and an accurate evaluation cannot be made. When exposure is performed in the at-rest state, the wedge prism 21 is rotated about the optic axis 36 by the prism driver 101 in response to a command from the main controller 104 in FIG. 1, thereby deflecting the light flux and changing the positions and angles of incidence of the light beam LB1 and light beam LB2 on the incidence plane of the optical integrator 22 pulse by pulse. As a consequence, the phase of the interference fringes on the reticle R and wafer W also changes pulse by pulse and a uniform illumination distribution that is unaffected by the interference fringes within the illuminated area is obtained as a result of performing at-rest exposure based upon a prescribed number of pulses.

On the other hand, the excimer laser 11 serving as the light source is such that the pulse-by-pulse energy is inconsistent within a certain area. In the case of at-rest exposure, therefore, it is contemplated to control the amount of exposure by a method disclosed in the specification of Japanese Patent Application Laid-Open No. 4-69660, for example, in order to obtain a prescribed integrated amount of exposure. When the wedge prism 21 is rotated in FIG. 1, the positions and angles of the light beams LB1, LB2 that impinge upon the optical integrator 22 change and so does the percentage of the light that reaches the reticle R and wafer W upon passing through the optical integrator 22. The relationship between the energy per pulse issued by the excimer laser 11 and the illumination of the illuminated surface, therefore, is no longer proportional. This brings about a variation in energy ascribable to rotation of the wedge prism 21, which is in addition to the variation in energy, pulse by pulse, of the excimer laser 11, and corresponds to an increase in the pulse-by-pulse variation in illumination on the illuminated surface.

In the case of scanning exposure as opposed to at-rest exposure, it is not possible to use a control method through which the integrated amount of exposure on a per-shot basis is rendered constant. Though a method of controlling light-emission timing is available, as disclosed in the specification of Japanese Patent Application Laid-Open No. 7-74092, as a method of controlling the amount of exposure in scanning exposure using a pulsed light source, it is necessary to minimize a pulse-by-pulse variation in illumination because such pulse-by-pulse variation in illumination depends upon the precision with which the amount of exposure is controlled. In the case of scanning exposure in which exposure is carried out in an interval within which the relative velocity of the wafer W and reticle R is constant, as in the prior art, the projection exposure apparatus of FIG. 1 is such that the rotation of the wedge prism 21 is changed by the prism driver 101 in accordance with the velocity in an interval of a constant stage velocity in response to a command from main controller 104. This eliminates the influence of rotation of the wedge prism 21 as one of the factors that causes a variation in illumination of the reticle R and, therefore, raises the precision with which the amount of exposure is controlled. As mentioned above, non-uniformity of the amount of exposure ascribable to the influence of interference fringes is reduced to problem-free level by the averaging effect of scanning exposure.

In particular, according to this embodiment, the arrangement is such that the excimer laser 11 serving as the pulsed light source emits pulsed light in a time interval that is inversely proportional to scanning velocity even during acceleration and deceleration of relative movement for transferring the image of the reticle R to the wafer W that travels in sync with the reticle R. Throughput is improved as a result. Further, according to this embodiment, light-emission limiting means changes the pulse generation period of a pulsed light source in accordance with stage scanning velocity, thereby correcting exposure non-uniformity ascribable to a fluctuation in stage travelling velocity.

Described next will be the features that characterize the scanning exposure operation according to this embodiment.

When the amount of pulse energy of individually emitted light pulses is substantially constant, a cumulative amount of exposure P of a wafer is represented by Equation (1) below.

$$P = q \times n \times Bx / Vx \tag{1}$$

where q represents amount of exposure accumulated over a single pulse of light emission, n the pulsed light-emission frequency, which signifies the number of pulses emitted per unit time, Bx an illumination area formed on the wafer by the masking blade (visual-field stop) 27, and Vx the travelling velocity of the wafer.

The pulsed light-emission frequency n for holding the cumulative amount of exposure P constant is a value represented by Equation (2) below.

$$n = P \times Vx / (q \times Bx) \tag{2}$$

Since q, Bx and P are constant values at this time, the pulsed light-emission frequency n is proportional to the travelling velocity Vx of the wafer. The relationship between a pulsed light-emission time interval Δt, which signifies the time interval between two neighboring pulses along the time axis, and the pulsed light-emission frequency n is represented by Equation (3) below.

$$\Delta t = 1/n \tag{3}$$

Further, a distance Δx travelled by the wafer over the pulsed light-emission time interval Δt is represented by Equation (4) below. If Equations (2) and (3) are substituted into Equation (4), it will be understood that Δx is a constant value.

$$\Delta x = \Delta t \times Vx = Vx/n = q \times Bx/P = \text{constant} \tag{4}$$

Further, since the reticle stage 31 and the wafer stage 35 exhibit a constant velocity ratio that is equal to magnification a of the projection optical system, a distance Δy travelled by the reticle is represented by Equation (5) below.

$$\Delta y = \Delta x / a \quad (5)$$

In other words, in order to hold the cumulative amount of exposure of the wafer constant even if stage velocity varies, it will suffice to control the pulsed light emission in such a manner that the pulsed light-emission frequency n, pulsed light-emission time interval Δt, wafer travelling distance Δx and reticle travelling distance Δy will satisfy Equations (2) to (5) indicative of the various conditions. In this case, if the rotational speed of the wedge prism 21 also is controlled in proportion to stage velocity, the pulse-by-pulse change in the phase of interference fringes in the illumination area and the stage velocity will be rendered constant irrespective of stage velocity, and illumination non-uniformity will be averaged. As a result, it is possible to perform ideal exposure that is independent of stage velocity.

In general, however, the geometrical set-up of the illumination optical system imposes a limitation upon a wedge prism and therefore the prism often is driven by a motor having a small torque, such as a small-size motor or hollow motor. On the other hand, since the inertia of the prism is large, it is difficult to achieve acceleration/deceleration in proportion to stage velocity if exposure is carried out during stage acceleration/deceleration. For this reason, the illuminator photometer 34 is used to previously obtain an optimum constant rotational speed that conforms to the stage driving pattern, and the rotational speed of the wedge prism 21 is made to agree with this optimum value in dependence upon the stage driving pattern.

Figure 2:
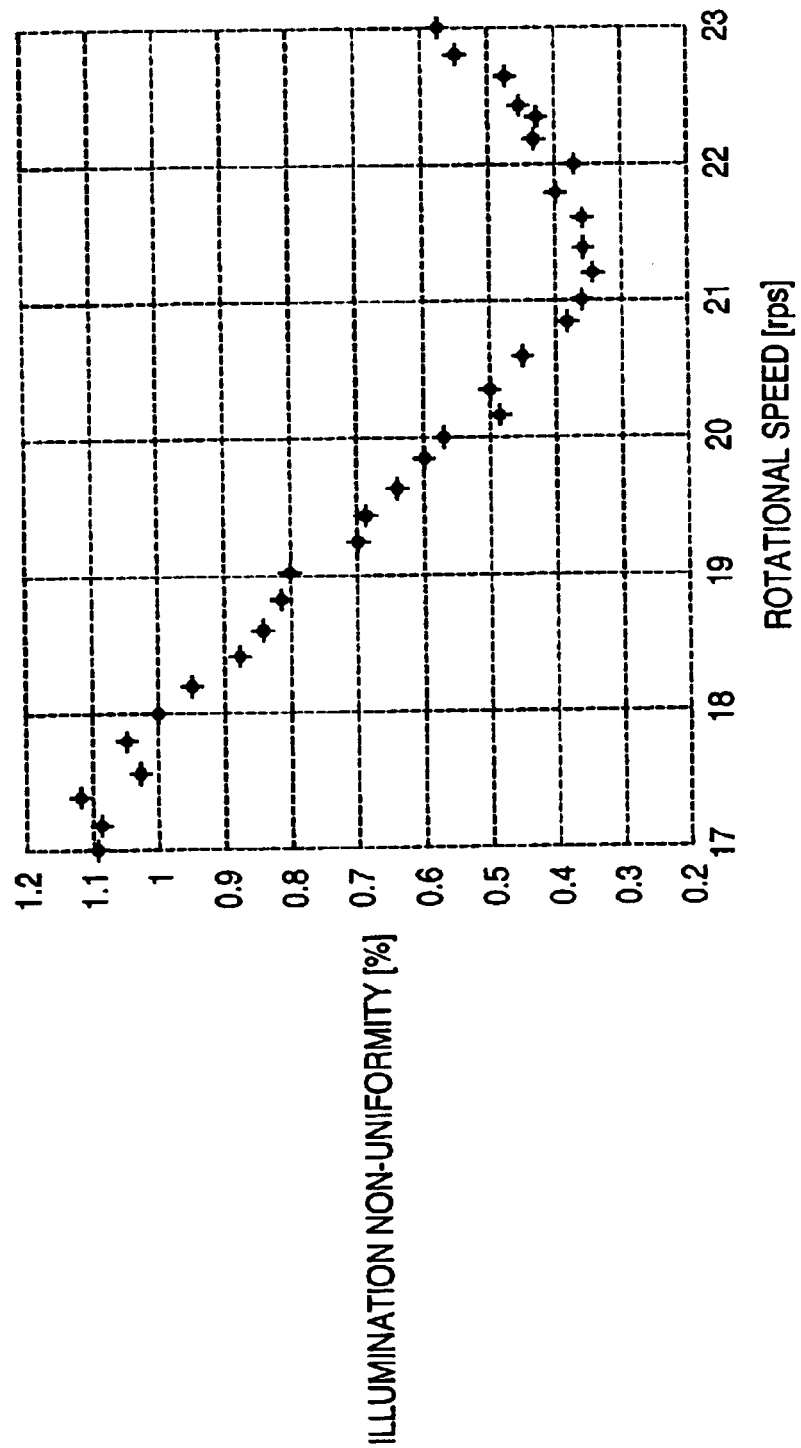
FIG. 2 is a graph illustrating the relationship between the rotational speed of a wedge prism and non-uniform illumination.

FIG. 2 is a graph illustrating the relationship between the rotational speed of the wedge prism 21 and non-uniform illumination in a case where exposure is carried out during acceleration/deceleration and at uniform velocity in a specific stage acceleration/deceleration pattern. The rotational speed of the wedge prism 21 is plotted along the horizontal axis of the graph, and illumination non-uniformity measured by the illuminator photometer 34 is plotted along the vertical axis. In FIG. 2, illumination non-uniformity is smallest at a rotational speed of about 21 (rps). It will be understood that making the rotational speed approximately 21 (rps) is ideal for this driving pattern. Further, an approximation may be made by a quadratic curve or the like based upon these data, and the rotational speed may be found from the inflection points of this curve. Alternatively, a relationship among the rotational speed of the wedge prism 21, the stage driving pattern and exposure non-uniformity may be found from an equation, or an approximation equation may be found based upon actually measured values. Then, when actual exposure is carried out, rotational speed in accordance with the stage driving pattern may be obtained based upon these equations.

FIGS. 3A to 3E are diagrams illustrating the relationship between rotational speed (FIG. 3D) of the wedge prism during scanning exposure and traveling velocity (FIG. 3A) of the reticle stage, traveling velocity (FIG. 3B) of the wafer stage and pulsed light-emission frequency (FIG. 3C) obtained by the above-described technique. It will be understood from FIGS. 3A to 3E that since the prism 21 rotates at constant speed even during scanning exposure, control can be carried out in simple fashion without imposing a load upon the driving system of the prism 21.

Figure 3A:
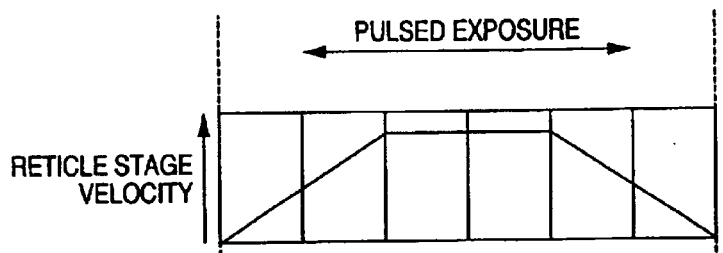
FIGS. 3A to 3E are explanatory views illustrating the relationship among traveling velocity of a reticle stage, traveling velocity of a wafer stage, pulsed light-emission frequency and rotational speed of a wedge prism.
Figure 3B:
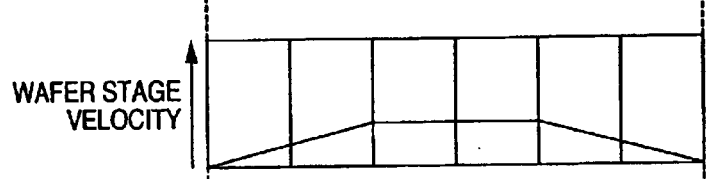
Figure 3C:
Figure 3D:
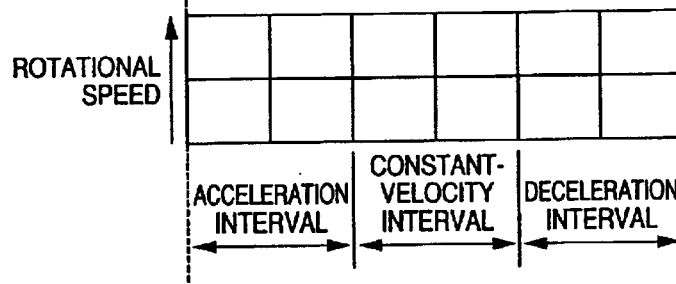
Figure 3E:
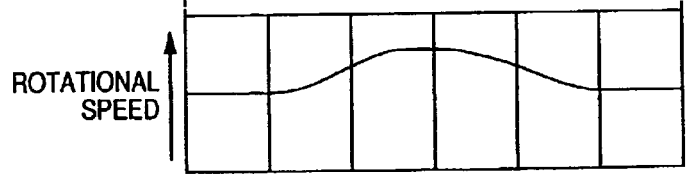

On the other hand, if the edge prism 21 can be driven by a control pattern based on low degree functions, for example, a secondary function or trigonometric functions, the rotational speed of the wedge prism 21 does not need to be constant. In this case, the drive pattern which provides with the smallest illumination non-uniformity as well as the relation shown in FIG. 2 can be selected. The rotational speed of the wedge prism 21 driven with the selected drive pattern is shown in FIG. 3E.

Further, there are instances in which the stage acceleration/deceleration pattern is changed in a case of a peripheral shot. In such a case, the rotational speed of the wedge prism 21 is changed between shots to an optimum driving pattern for the peripheral shot. FIGS. 4A to 4D illustrate such a situation. Specifically, FIGS. 4A to 4D are diagrams illustrating the relationship between rotational speed (FIG. 4D) of the wedge prism and traveling velocity (FIG. 4A) of the reticle stage, traveling velocity (FIG. 4B) of the wafer stage and pulse light-emission frequency (FIG. 4C). It will be understood that the rotational speed changes smoothly between shots (401, 402) in FIG. 4D. It will suffice to change the rotational speed of the wedge prism 21 when a step is made in the X direction. In a case wherein the rotational speed is changed at the time of stage acceleration/deceleration, therefore, a control band on the order of 100 Hz is required. In such a case, however, it will suffice if rotation is changed on the order of 100 ms, and a band on the order of 10 to 20 Hz will be sufficient. This results in a simpler prism driving system.

In this embodiment, exposure non-uniformity is eliminated using a wedge prism. However, the present invention can be applied similarly even in an optical system constituted by an oscillating mirror such as a galvanometer mirror.

[Embodiment of A Semiconductor Production System]

Described next will be an example of a system for producing semiconductor devices (semiconductor chips such as IC and LSI chips, liquid crystal panels, CCDS, thin-film magnetic heads and micromachines, etc.) utilizing an exposure apparatus having an illumination device according to the present invention. This system utilizes a computer network outside the semiconductor manufacturing plant to provide troubleshooting and regular maintenance of manufacturing equipment installed at the manufacturing plant and to furnish maintenance service such as the provision of software.

Figure 5:
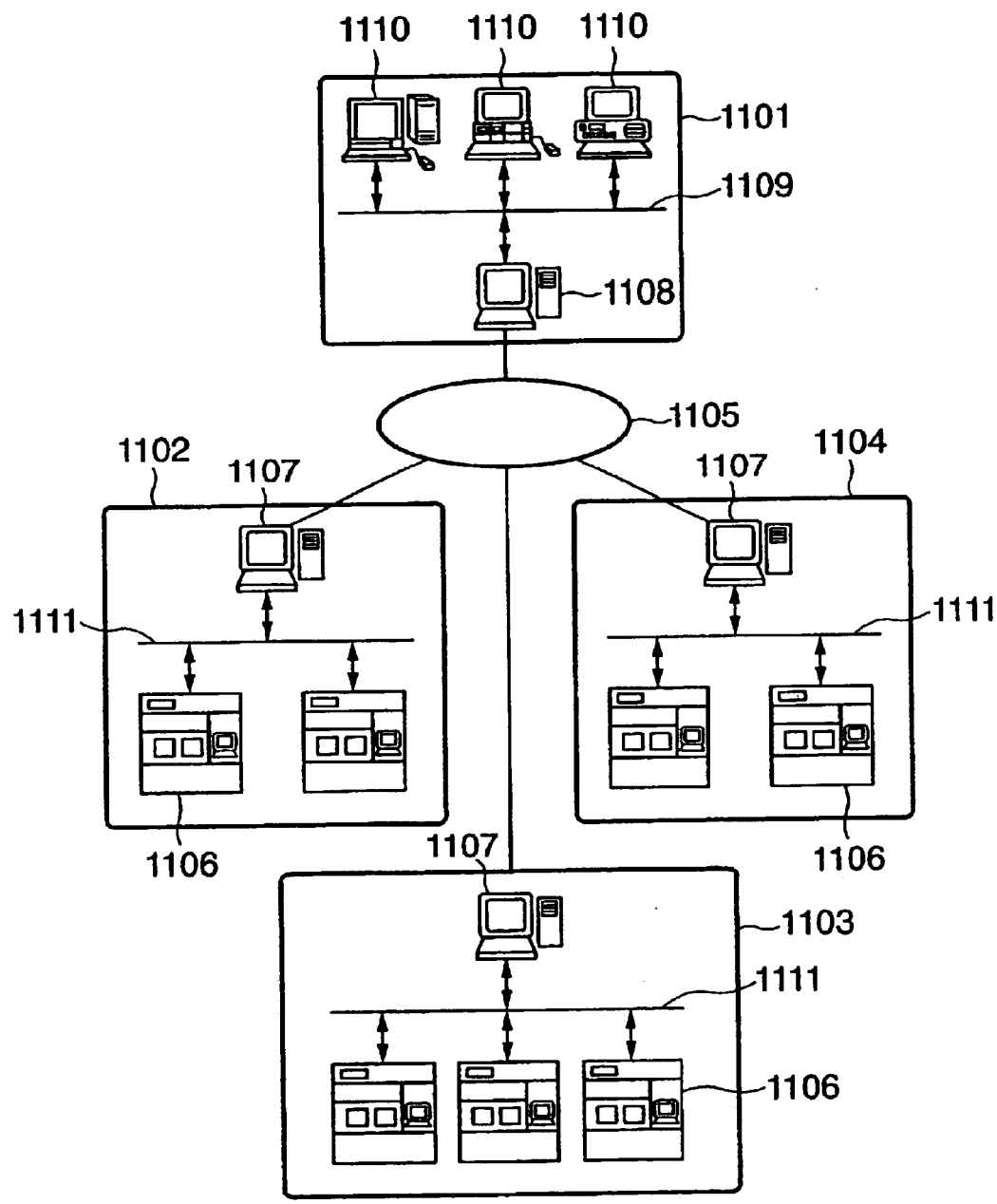
FIG. 5 is a conceptual view showing a semiconductor device production system, which employs an apparatus according to the present invention, as seen from a certain angle.

FIG. 5 illustrates the overall system as seen from a certain angle. The system includes a business office 1101 of the vendor (equipment supplier) that provides the apparatus for manufacturing semiconductor devices. Semiconductor manufacturing apparatus for performing various processes used in a semiconductor manufacturing plant are assumed to be the manufacturing apparatus. Examples of the apparatus are pre-treatment apparatus (e.g., lithographic apparatus such as exposure apparatus, resist treatment apparatus and etching apparatus, heat treatment apparatus, thin-film apparatus and smoothing apparatus, etc.) and post-treatment apparatus (e.g., assembly apparatus and inspection apparatus, etc.). The business office 1101 includes a host management system 1108 for providing a manufacturing-apparatus maintenance database, a plurality of control terminal computers 1110, and a local-area network (LAN) 1109 for connecting these components into an intranet. The host management system 1108 has a gateway for connecting the LAN 1109 to the Internet 1105, which is a network external to the business office 1101, and a security function for limiting access from the outside.

Numerals 1102 to 1104 denote manufacturing plants of semiconductor makers which are the users of the manufacturing apparatus. The manufacturing plants 1102 to 1104 may be plants belonging to makers that differ from one another or plants belonging to the same maker (e.g., pretreatment plants and post-treatment plants, etc.). Each of the plants 1102 to 1104 is provided with a plurality of manufacturing apparatus 1106, a local-area network (LAN) 1111 which connects these apparatus to construct an intranet, and a host management system 1107 serving as a monitoring unit for monitoring the status of operation of each manufacturing apparatus 1106. The host management system 1107 provided at each of the plants 1102 to 1104 has a gateway for connecting the LAN 1111 in each plant to the Internet 1105 serving as the external network of the plants. As a result, it is possible for the LAN of each plant to access the host management system 1108 on the side of the vendor 1101 via the Internet 1105. By virtue of the security function of the host management system 1108, users allowed to access the host management system 1108 are limited. More specifically, status information (e.g., the condition of manufacturing apparatus that has malfunctioned), which indicates the status of operation of each manufacturing apparatus 1106, can be reported from the plant side to the vendor side via the Internet 1105. In addition, information in response to such notification (e.g., information specifying how to troubleshoot the problem, troubleshooting software and data, etc.), as well as the latest software and maintenance information such as help information, can be acquired from the vendor side. A communication protocol (TCP/IP), which is used generally over the Internet, is employed for data communication between the plants 1102~1104 and the vendor 1101 and for data communication over the LAN 1111 within each plant. Instead of utilizing the Internet as the external network of a plant, it is also possible to utilize a highly secure leased-line network (ISDN, etc.) that cannot be accessed by a third party. Further, the host management system is not limited to that provided by a vendor, for an arrangement may be adopted in which the user constructs a database, places it on an external network and allows the database to be accessed from a number of plants of users.

Figure 6:
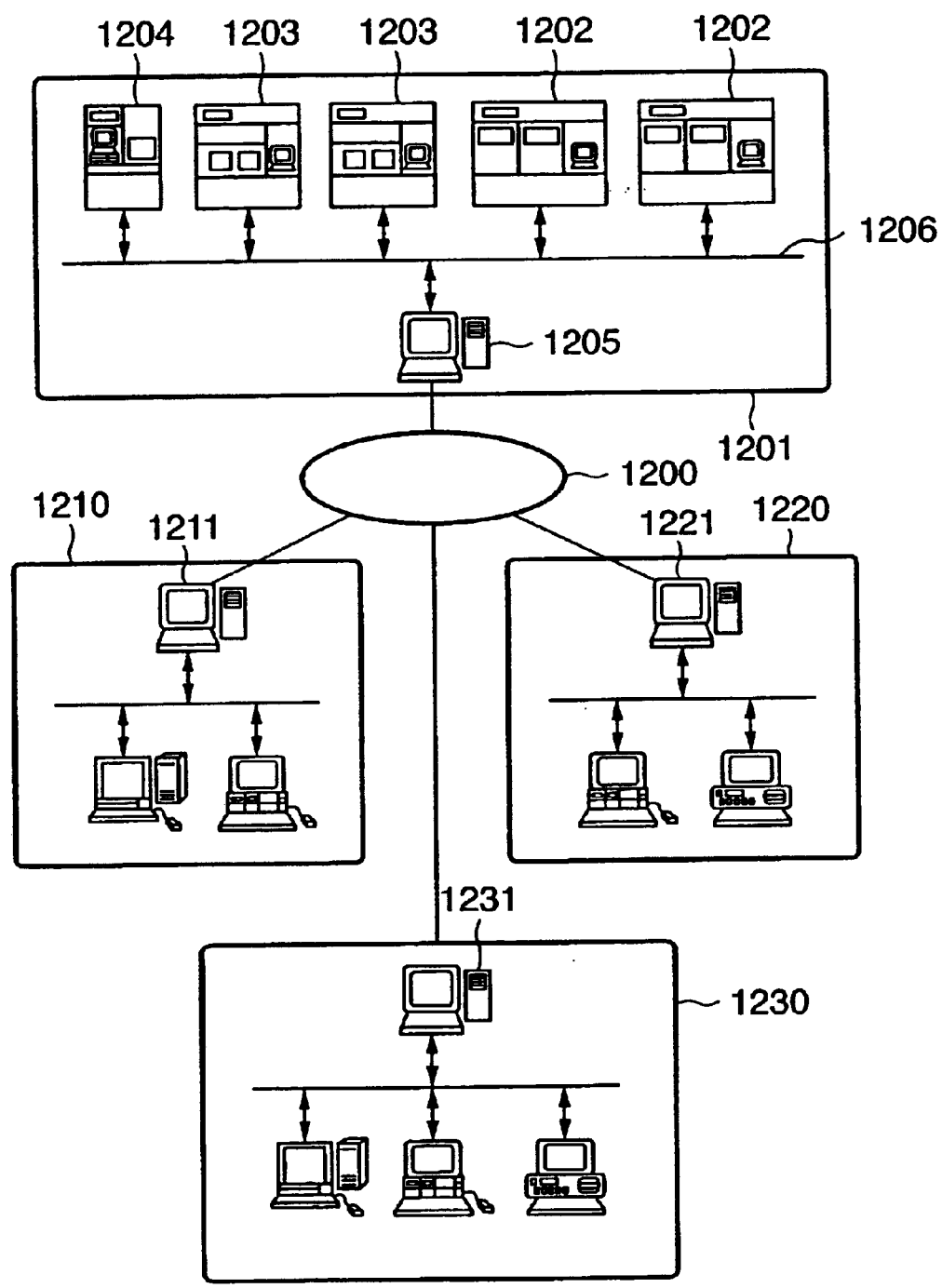
FIG. 6 is a conceptual view showing the semiconductor device production system, which employs the apparatus according to the present invention, as seen from another angle.

FIG. 6 is a conceptual view illustrating the overall system of this embodiment as seen from an angle different from that depicted in FIG. 5. In the earlier example, a plurality of user plants each having manufacturing apparatus are connected by an external network to the management system of the vendor that provided the manufacturing apparatus, and information concerning the production management of each plant and information concerning at least one manufacturing apparatus is communicated by data communication via the external network. In the example of FIG. 6, on the other hand, a plant having a manufacturing apparatus provided by a plurality of vendors is connected an outside network to management systems of respective ones of the vendors of these plurality of manufacturing apparatus, and maintenance information for each manufacturing apparatus is communicated by data communication. As shown in the drawing, the system includes a manufacturing plant 1201 of the user of the manufacturing apparatus (the maker of semiconductor devices). The manufacturing line of this plant includes manufacturing apparatus for implementing a variety of processes. Examples of such apparatus are exposure apparatus 1202, resist treatment apparatus 1203 and thin-film treatment apparatus 1204. Though only one manufacturing plant 1201 is shown in FIG. 6, in actuality, a plurality of these plants are networked in the same manner. The apparatus in the plant are interconnected by a LAN 1206 to construct an intranet and the operation of the manufacturing line is managed by a host management system 1205.

The business offices of vendors (equipment suppliers) such as an exposure apparatus maker 1210, a resist treatment apparatus maker 1220 and a thin-film apparatus equipment maker 1230 have host management systems 1211, 1221, 1231, respectively, for remote maintenance of the apparatus they have supplied. These have maintenance databases and gateways to the outside network, described earlier. The host management system 1205 for managing each apparatus in the manufacturing plant of the user is connected to the management systems 1211, 1221, 1231 of the vendors of these apparatus by the Internet or leased-line network serving as an external network 1200. If any of the series of equipment in the manufacturing line malfunctions, the line ceases operating. However, this can be dealt with rapidly by receiving remote maintenance from the vendor of the faulty equipment via the Internet 1200, thereby making it possible to minimize line downtime.

Each manufacturing apparatus installed in the semiconductor manufacturing plant has a display, a network interface and a computer for executing network-access software and equipment operating software stored in a storage device.

The storage device can be an internal memory or hard disk or a network file server. The software for network access includes a special-purpose or general-purpose Web browser and presents a user interface, which has a screen of the kind shown by way of example in FIG. 7, on the display. The operator managing the manufacturing equipment at each plant enters information at the input items on the screen while observing the screen. The information includes model 1401 of the manufacturing apparatus, its serial number 1402, subject matter 1403 of the problem, its date of occurrence 1404, degree of urgency 1405, the particular condition 1406, countermeasure method 1407 and progress report 1408. The entered information is transmitted to the maintenance database via the Internet. The resulting appropriate maintenance information is sent back from the maintenance database and is presented on the display screen. The user interface provided by the Web browser implements hyperlink functions 1410, 1411, 1412 as illustrated and enables the operator to access more detailed information for each item, to extract the latest version of software, which is used for the manufacturing equipment, from a software library provided by the vendor, and to acquire an operating guide (help information) for reference by the plant operator. Accordingly, the maintenance information provided by the maintenance database also includes information relating to the present invention described above, and the software library also provides the latest software for implementing the present invention.

Figure 8:
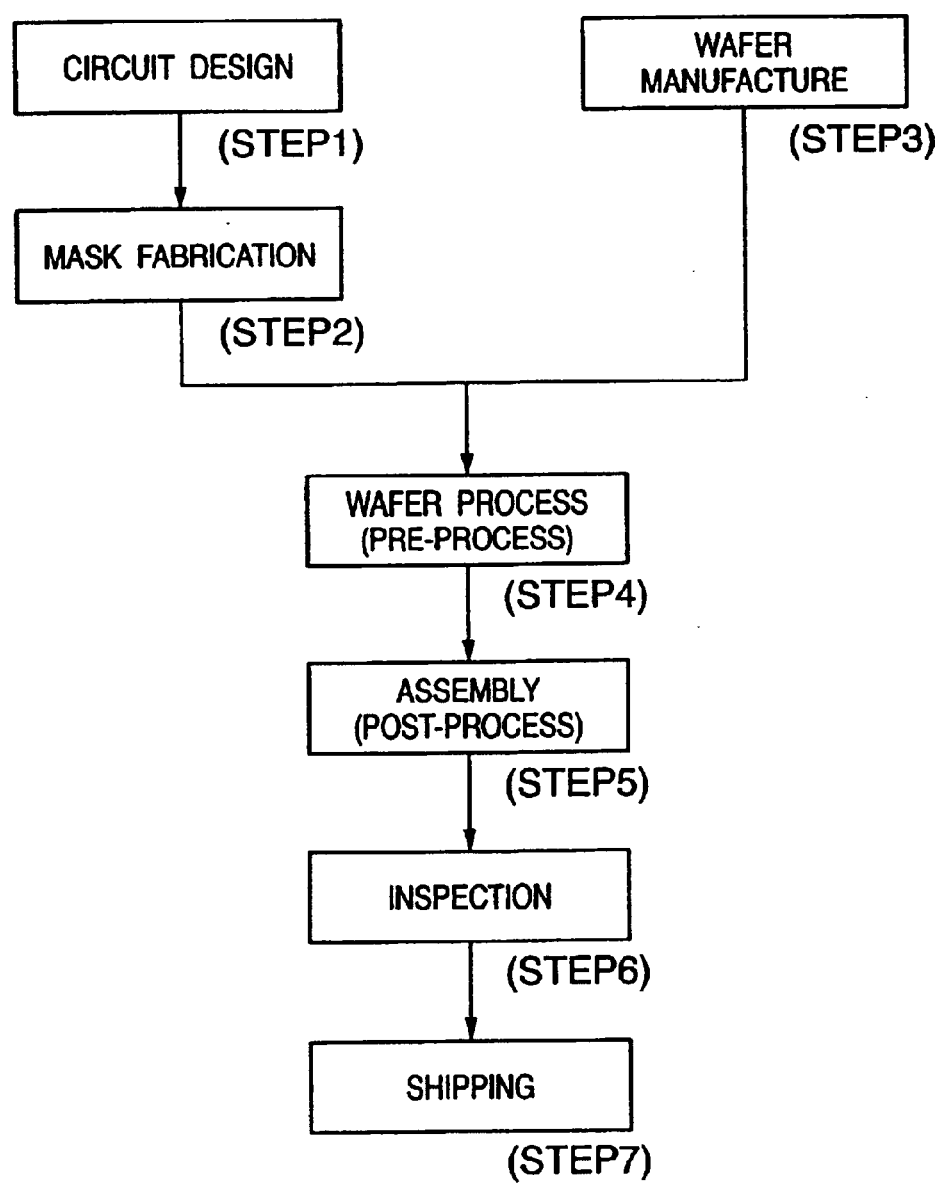
FIG. 8 is a diagram useful in describing the flow of a device manufacturing process.

A process for manufacturing a semiconductor device utilizing the production system set forth above will now be described. FIG. 8 illustrates the overall flow of a process for manufacturing semiconductor devices. The circuit for the device is designed at step 1 (circuit design). A mask on which the designed circuit pattern has been formed is fabricated at step 2 (mask fabrication). Meanwhile, a wafer is manufactured using a material such as silicon or glass at step 3 (wafer manufacture). The actual circuit is formed on the wafer by lithography, using the mask and wafer that have been prepared, at step 4 (wafer process), which is also referred to as "pre-treatment". A semiconductor chip is obtained, using the wafer fabricated at step 4, at step 5 (assembly), which is also referred to as "post-treatment". This step includes steps such as actual assembly (dicing and bonding) and packaging (chip encapsulation). The semiconductor device fabricated at step 5 is subjected to inspections such as an operation verification test and durability test at step 6 (inspection). The semiconductor device is completed through these steps and then is shipped (step 7). The pre- and post-treatments are performed at separate special-purpose plants. Maintenance is carried out on a per-plant basis by the above-described remote maintenance system. Further, information for production management and equipment maintenance is communicated by data communication between the pre- and post-treatment plants via the Internet or leased-line network.

Figure 9:
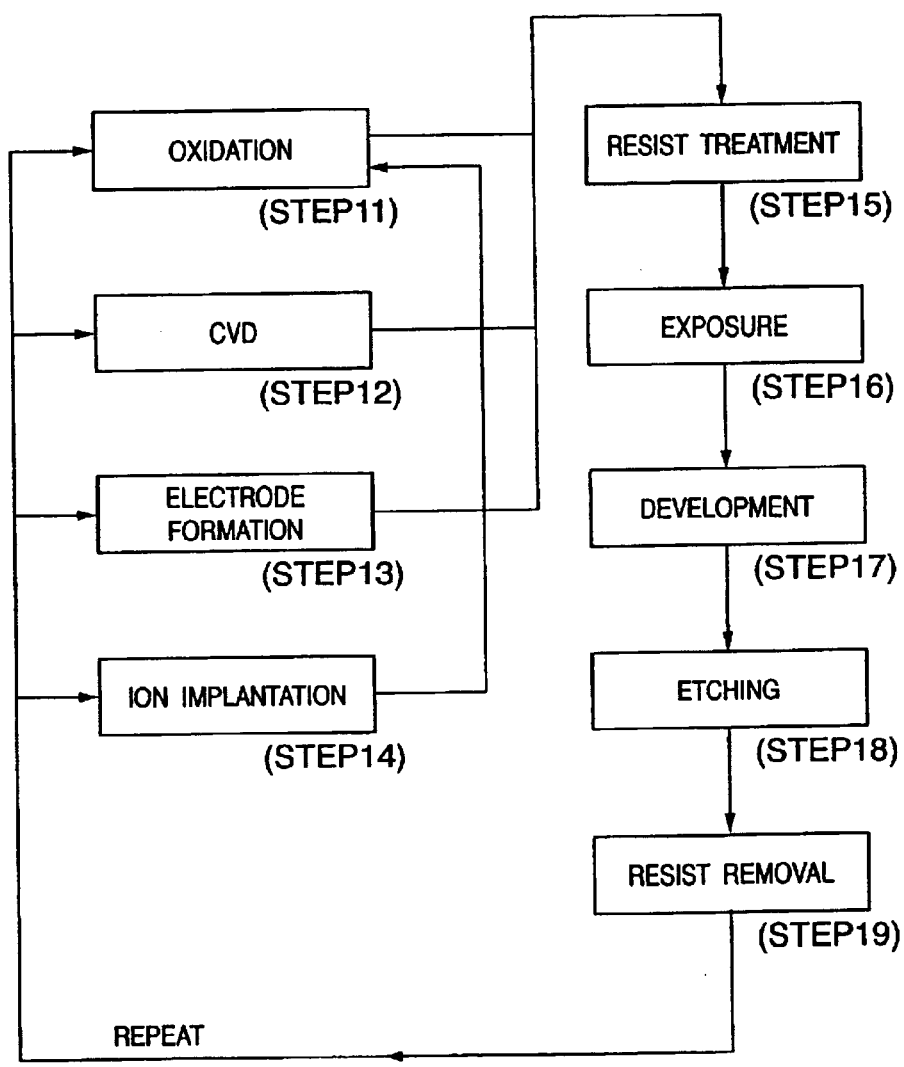
FIG. 9 is a diagram useful in describing a wafer process.

FIG. 9 is a flowchart illustrating the detailed flow of the wafer process mentioned above. The surface of the wafer is oxidized at step 11 (oxidation). An insulating film is formed on the wafer surface at step 12 (CVD), electrodes are formed on the wafer by vapor deposition at step 13 (electrode formation), and ions are implanted in the wafer at step 14 (ion implantation). The wafer is coated with a photoresist at step 15 (resist treatment), the wafer is exposed to the circuit pattern of the mask to print the pattern onto the wafer by the above-described exposure apparatus at step 16 (exposure), and the exposed wafer is developed at step 17 (development). Portions other than the developed photoresist are etched away at step 18 (etching), and unnecessary resist left after etching is performed is removed at step 19 (resist removal). Multiple circuit patterns are formed on the wafer by implementing these steps repeatedly. Since the manufacturing equipment used at each step is maintained by the remote maintenance system described above, malfunctions can be prevented and quick recovery is possible if a malfunction should happen to occur. As a result, the productivity of semiconductor device manufacture can be improved over the prior art.

Thus, in accordance with the present invention as described above, an illumination device is provided with illumination-distribution varying means for temporarily varying the illumination distribution of an illumination unit for exposure, wherein the illumination-distribution varying means optimizes the temporary change of the illumination distribution in conformity with a pattern for driving a movable stage. As a result, an illumination area can be subjected to scanning illumination highly precisely without irradiation non-uniformity (exposure non-uniformity) even when exposure is carried out during acceleration and deceleration. This makes it possible to manufacture semiconductor devices at a high throughput.

Further, according to the present invention, an illumination device is provided with an optical member for temporarily varying the illumination distribution, means for driving the optical member, and means for measuring illumination distributions that conform to acceleration/deceleration patterns of various stages, wherein a pattern for driving the optical member is optimized based upon results of measuring the illumination distribution. As a result, a temporary change in illumination distribution can be optimized in a simple manner.

As many apparently widely different embodiments of the present invention can be made without departing from the spirit and scope thereof, it is to be understood that the invention is not limited to the specific embodiments thereof except as defined in the appended claims.

What is claimed is:

1. An illumination device for a scanning exposure apparatus for carrying out exposure even when a movable stage is being accelerated by acceleration in an acceleration interval or decelerated by deceleration in a deceleration interval, said device comprising:

an illumination measurement unit for measuring illumination of pulsed light on a surface of a wafer mounted on the movable stage, wherein the illumination measurement unit is used to obtain a condition in order to control an illumination distribution within an illumination area in accordance with a driving pattern of the movable stage, including the acceleration interval and the deceleration interval; and illumination-distribution varying means for varying a phase of the illumination distribution for each pulsed light within the illumination area of an illumination unit that is performing the exposure, based on the obtained condition, wherein said illumination-distribution varying means has a function for varying the phase of the illumination distribution of each pulsed light in accordance with the acceleration in the acceleration interval, the deceleration in the deceleration interval, or a velocity in a constant velocity interval of the movable stage.

2. An illumination device for a scanning exposure apparatus for carrying out exposure even when a movable stage is being accelerated by acceleration in an acceleration interval or decelerated by deceleration in a deceleration interval, said device comprising:

an illumination measurement unit for measuring illumination of pulsed light on a surface of a wafer mounted on the movable stage, wherein the illumination measurement unit is used to obtain a condition in order to control an illumination distribution within an illumination area in accordance with a driving pattern of the movable stage, including the acceleration interval and the deceleration interval; and an optical member for varying a phase of the illumination distribution for each pulsed light within the illumination area of an illumination unit that is for performing the exposure; and means for driving said optical member based on the obtained condition, wherein a pattern for driving said optical member is decided based upon results of measuring the illumination distribution corresponding to the driving pattern of the acceleration interval or the driving pattern of the deceleration interval of the stage.

3. The device according to claim 2, wherein the pattern for driving said optical member is constant within a shot.

4. An illumination device for a scanning exposure apparatus for carrying out exposure even when a movable stage is being accelerated by acceleration in an acceleration interval or decelerated by deceleration in a deceleration interval, said device comprising:

an illumination measurement unit for measuring illumination of pulsed light on a surface of a wafer mounted on the movable stage, wherein the illumination measurement unit is used to obtain a condition in order to control an illumination distribution within an illumination area in accordance with a driving pattern of the movable stage, including the acceleration interval and the deceleration interval; and illumination-distribution varying means for varying a phase of the illumination distribution for each pulsed light within the illumination area of an illumination unit that is for performing the exposure, based on the obtained condition, wherein said illumination-distribution varying means varies the phase of the illumination distribution based on the obtained condition of a changing rate of a velocity or an angular velocity of said illumination-distribution varying means, which is less than the acceleration in the acceleration interval or the deceleration in the deceleration interval of the movable stage, and varies the phase of the illumination distribution of the illumination unit periodically irrespective of acceleration and deceleration of the stage.

5. The device according to claim 4, wherein the period of the temporary change of the phase of the illumination distribution for each pulsed light varies in conformity with the acceleration interval or the deceleration interval of the stage.

6. An exposure apparatus comprising:

an illumination device for controlling an illumination distribution;

a stage for holding substrate, driving the substrate to a predetermined position and positioning the substrate at the predetermined position; and a projection optics unit for projecting a pattern, which is illuminated by said illumination device, onto the substrate, said illumination device, which is for carrying out exposure even when a movable stage is being accelerated by acceleration in an acceleration interval or decelerated by deceleration in a deceleration interval, including:

(i) an illumination measurement unit for measuring illumination of pulsed light on a surface of a wafer mounted on the movable stage, wherein the illumination measurement unit is used to obtain a condition in order to control an illumination distribution within an illumination area in accordance with a driving pattern of the movable stage, including the acceleration interval and the deceleration interval; and (ii) illumination-distribution varying means for varying a phase of the illumination distribution for each pulsed light within the illumination area of an illumination unit that is for performing the exposure, based on the obtained condition, wherein said illumination-distribution varying means has a function for varying the phase of the illumination distribution of each pulsed light in accordance with the acceleration in the acceleration interval, the deceleration in the deceleration interval, or a velocity in a constant velocity interval of the movable stage.

7. An exposure apparatus comprising:

an illumination device for controlling an illumination distribution;

a stage for holding substrate, driving the substrate to a predetermined position and positioning the substrate at the predetermined position; and a projection optics unit for projecting a pattern, which is illuminated by said illumination device, onto the substrate, said illumination device, which is for carrying out exposure even when a movable stage is being accelerated by acceleration in an acceleration interval or decelerated by deceleration in a deceleration interval, including:

(i) an illumination measurement unit for measuring illumination of pulsed light on a surface of a wafer mounted on the movable stage, wherein the illumination measurement unit is used to obtain a condition in order to control an illumination distribution within an illumination area in accordance with a driving pattern of the movable stage, including the acceleration interval and the deceleration interval; and (ii) an optical member for varying a phase of the illumination distribution for each pulsed light within the illumination area of an illumination unit that is for performing the exposure; and (iii) means for driving said optical member based on the obtained correction, wherein a pattern for driving said optical member is decided based upon results of measuring the illumination distribution corresponding to the driving pattern of the acceleration interval or the driving pattern of the deceleration interval of the stage.

8. An exposure apparatus comprising:

an illumination device for controlling an illumination distribution;

a stage for holding substrate, driving the substrate to a predetermined position and positioning the substrate at the predetermined position; and a projection optics unit for projecting a pattern, which is illuminated by said illumination device, onto the substrate, said illumination device, which is for carrying out exposure even when a movable stage is being accelerated by acceleration in an acceleration interval or decelerated by deceleration in a deceleration interval, including:

(i) an illumination measurement unit for measuring illumination of pulsed light on a surface of a wafer mounted on the movable stage, wherein the illumination measurement unit is used to obtain a condition in order to control an illumination distribution within an illumination area in accordance with a driving pattern of the movable stage, including the acceleration interval and the deceleration interval; and (ii) illumination-distribution varying means for temporarily varying a phase of the illumination distribution for each pulsed light within the illumination area of an illumination unit that is for performing the exposure, based on the obtained condition, wherein said illumination-distribution varying means varies the phase of the illumination distribution based on the obtained condition of a changing rate of a velocity or an angular velocity of said illumination-distribution varying means, which is less than the acceleration in the acceleration interval or the deceleration in the deceleration interval of the movable stage, and varies the phase of the illumination distribution of the illumination unit periodically.

9. An exposure method comprising:

a step of controlling an illumination device that controls an illumination distribution;

a stage control step of holding a substrate, driving the substrate to a predetermined position and positioning the substrate at the predetermined position; and a step of setting a projection optics unit for projecting a pattern, which is illuminated by the illumination device, onto the substrate, the illumination device, which is for carrying out exposure even when a movable stage is being accelerated by acceleration in an acceleration interval or decelerated by deceleration in a deceleration interval, including:

(i) an illumination measurement unit for measuring illumination of pulsed light on a surface of a wafer mounted on the movable stage, wherein the illumination measurement unit is used to obtain a condition in order to control an illumination distribution within an illumination area in accordance with a driving pattern of the movable stage, including the acceleration interval and the deceleration interval; and (ii) illumination-distribution varying means for varying a phase of the illumination distribution for each pulsed light within the illumination area of an illumination unit that is for performing the exposure, based on the obtained condition, wherein the illumination-distribution varying means has a function for varying the phase of the illumination distribution of each pulsed light in accordance with the acceleration in the acceleration interval, the deceleration in the deceleration interval, or a velocity in a constant velocity interval of the movable stage.

10. An exposure method comprising:

a step of controlling an illumination device that controls an illumination distribution;

a stage control step of holding a substrate, driving the substrate to a predetermined position and positioning the substrate at the predetermined position; and a step of setting a projection optics unit for projecting a pattern, which is illuminated by the illumination device, onto the substrate, the illumination device, which is for carrying out exposure even when a movable stage is being accelerated by acceleration in an acceleration interval or decelerated by deceleration in a deceleration interval, including:

(i) an illumination measurement unit for measuring illumination of pulsed light on a surface of a wafer mounted on the movable stage, wherein the illumination measurement unit is used to obtain a condition in order to control an illumination distribution within an illumination area in accordance with a driving pattern of the movable stage, including the acceleration interval and the deceleration interval;

(ii) an optical member for varying a phase of the illumination distribution for each pulsed light within the illumination area of an illumination unit that is for performing the exposure; and (iii) means for driving said optical member, based on the obtained condition, wherein a pattern for driving the optical member is decided based upon results of measuring the illumination distribution corresponding to the driving pattern in the acceleration interval or the driving pattern in the deceleration interval of the stage.

11. An exposure method comprising:

a step of controlling an illumination device that controls an illumination distribution;

a stage control step of holding a substrate, driving the substrate to a predetermined position and positioning the substrate at the predetermined position; and a step of setting a projection optics unit for projecting a pattern, which is illuminated by the illumination device, onto the substrate, the illumination device, which is for carrying out exposure even when a movable stage is being accelerated by acceleration in an acceleration interval or decelerated by deceleration in a deceleration interval, including:

(i) an illumination measurement unit for measuring illumination of pulsed light on a surface of a wafer mounted on the movable stage, wherein the illumination measurement unit is used to obtain a condition in order to control an illumination distribution within an illumination area in accordance with a driving pattern of the movable stage, including the acceleration interval and the deceleration interval; and (ii) illumination-distribution varying means for varying a phase of the illumination distribution for each pulsed light within the illumination area of an illumination unit that is for performing the exposure, based on the obtained condition, wherein the illumination-distribution varying means varies the phase of the illumination distribution based on the obtained condition of a changing rate of a velocity or an angular velocity of the illuminating-distribution varying means, which is less than the acceleration in the acceleration interval or the deceleration in the deceleration interval of the movable stage, and varies the phase of the illumination distribution of the illumination unit periodically.

12. A method of manufacturing a semiconductor device, said method comprising the steps of:

placing a plurality of semiconductor manufacturing apparatus, inclusive of an exposure apparatus, in a plant for manufacturing semiconductor devices; and manufacturing a semiconductor device using the plurality of semiconductor manufacturing apparatus, the exposure apparatus including:

an illumination device for controlling an illumination distribution;

a stage for holding substrate, driving the substrate to a predetermined position and positioning the substrate at the predetermined position; and a projection optics unit for projecting a pattern, which is illuminated by the illumination device, onto the substrate, the illumination device, which is for carrying out exposure even when a movable stage is being accelerated by acceleration in an acceleration interval or decelerated by deceleration in a deceleration interval, including:

(i) an illumination measurement unit for measuring illumination of pulsed light on a surface of a wafer mounted on the movable stage, wherein the illumination measurement unit is used to obtain a condition in order to control an illumination distribution within an illumination area in accordance with a driving pattern of the movable stage, including the acceleration interval and the deceleration interval; and (ii) illumination-distribution varying means for varying a phase of the illumination distribution for each pulsed light within the illumination area of an illumination unit that is for performing the exposure, based on the obtained condition, wherein the illumination-distribution varying means has a function for varying the phase of the illumination distribution of each pulsed light in accordance with the acceleration in the acceleration interval, the deceleration in the deceleration interval, or a velocity in a constant velocity interval of the movable stage.

13. A method of manufacturing a semiconductor device, said method comprising the steps of:

placing a plurality of semiconductor manufacturing apparatus, inclusive of an exposure apparatus, in a plant for manufacturing semiconductor devices; and manufacturing a semiconductor device using the plurality of semiconductor manufacturing apparatus, the exposure apparatus including:

an illumination device for controlling an illumination distribution;

a stage for holding a substrate, driving the substrate to a predetermined position and positioning the substrate at the predetermined position; and a projection optics unit for projecting a pattern, which is illuminated by the illumination device, onto the substrate, the illumination device, which is for carrying out exposure even when a movable stage is being accelerated by acceleration in an acceleration interval or decelerated by deceleration in a deceleration interval, including:

(i) an illumination measurement unit for measuring illumination of pulsed light on a surface of a wafer mounted on the movable stage, wherein the illumination measurement unit is used to obtain a condition in order to control an illumination distribution within an illumination area in accordance with a driving pattern of the movable stage, including the acceleration interval and the deceleration interval;

(ii) an optical member for varying a phase of the illumination distribution for each pulsed light within the illumination area of an illumination unit that is for performing the exposure; and (iii) means for driving the optical member based on the obtained condition, wherein a pattern for driving the optical member is decided based upon results of measuring the illumination distribution corresponding to the driving pattern in the acceleration interval or the driving pattern in the deceleration interval of the stage.

14. A method of manufacturing a semiconductor device, said method comprising the steps of:

placing a plurality of semiconductor manufacturing apparatus, inclusive of an exposure apparatus, in a plant for manufacturing semiconductor devices; and manufacturing a semiconductor device using the plurality of semiconductor manufacturing apparatus, the exposure apparatus including:

an illumination device for controlling an illumination distribution;

a stage for holding a substrate, driving the substrate to a predetermined position and positioning the substrate at the predetermined position; and a projection optics unit for projecting a pattern, which is illuminated by the illumination device, onto the substrate, the illumination device, which is for carrying out exposure even when a movable stage is being accelerated by acceleration in an acceleration interval or decelerated by deceleration in a deceleration interval, including:

(i) an illumination measurement unit for measuring illumination of pulsed light on a surface of a wafer mounted on the movable stage, wherein the illumination measurement unit is used to obtain a condition in order to control an illumination distribution within an illumination area in accordance with a driving pattern of the movable stage, including the acceleration interval and the deceleration interval; and (ii) illumination-distribution varying means for varying a phase of the illumination distribution for each pulsed light within the illumination area of an illumination unit that is for performing the exposure based on the obtained condition, wherein the illumination-distribution varying means varies the phase of the illumination distribution based on the obtained condition of a changing rate of a velocity or an angular velocity of the illumination distribution varying means, which is less than the acceleration in the acceleration interval or the deceleration in the deceleration interval of the movable stage, and varies the phase of the illumination distribution of the illumination unit periodically.

15. The method according to claim 12, further comprising the steps of:

interconnecting the plurality of semiconductor manufacturing apparatus by a local-area network;

connecting the local-area network and an external network outside the plant;

acquiring information relating to the exposure apparatus from a database on the external network utilizing the local-area network and the external network; and controlling the exposure apparatus based upon the information acquired.

16. The method according to claim 13, further comprising the steps of:

interconnecting the plurality of semiconductor manufacturing apparatus by a local-area network;

connecting the local-area network and an external network outside the plant;

acquiring information relating to the exposure apparatus from a database on the external network utilizing the local-area network and the external network; and controlling the exposure apparatus based upon the information acquired.

17. The method according to claim 14, further comprising the steps of:

interconnecting the plurality of semiconductor manufacturing apparatus by a local-area network;

connecting the local-area network and an external network outside the plant;

acquiring information relating to the exposure apparatus from a database on the external network utilizing the local-area network and the external network; and controlling the exposure apparatus based upon the information acquired.

18. The method according to claim 15, further comprising performing one of (i) obtaining maintenance information for the manufacturing apparatus by accessing, by data communication via the external network, a database provided by a vendor or user of the exposure apparatus, and (ii) production management by data communication with a semiconductor manufacturing plan other than the first-mentioned semiconductor manufacturing plant via the external network.

19. The method according to claim 16, further comprising performing one of (i) obtaining maintenance information for the manufacturing apparatus by accessing, by data communication via the external network, a database provided by a vendor or user of the exposure apparatus, and (ii) production management by data communication with a semiconductor manufacturing plant other than the first-mentioned semiconductor manufacturing plant via the external network.

20. The method according to claim 17, further comprising performing one of (i) obtaining maintenance information for the manufacturing apparatus by accessing, by data communication via the external network, a database provided by a vendor or user or the exposure apparatus, and (ii) production management by data communication with a semiconductor manufacturing plant other than the first-mentioned semiconductor manufacturing plant via the external network.

21. A semiconductor manufacturing plant, comprising:

a plurality of semiconductor manufacturing apparatus, inclusive of an exposure apparatus;

a local-area network for interconnecting said plurality of semiconductor manufacturing apparatus; and a gateway for connecting said local-area network and an external network outside said plant, said exposure apparatus including:

an illumination device for controlling an illumination distribution;

a stage for holding a substrate, driving the substrate to a predetermined position and positioning the substrate at the predetermined position; and a projection optics unit for projecting a pattern, which is illuminated by said illumination device, onto the substrate, said illumination device, which is for carrying out exposure even when a movable stage is being accelerated by acceleration in an acceleration interval or decelerated by deceleration in a deceleration interval, including:

(i) an illumination measurement unit for measuring illumination of pulsed light on a surface of a wafer mounted on the movable stage, wherein the illumination measurement unit is used to obtain a condition in order to control an illumination distribution within an illumination area in accordance with a driving pattern of the movable stage, including the acceleration interval and the deceleration interval; and (ii) illumination-distribution varying means for varying a phase of the illumination distribution for each pulsed light within the illumination area of an illumination unit that is for performing exposure, based on the obtained condition, wherein said illumination-distribution varying means has a function for varying the phase of the illumination distribution of each pulsed light in accordance with the acceleration in the acceleration interval, the deceleration in the deceleration interval, or a velocity in a constant velocity interval of the movable stage.

22. A semiconductor manufacturing plant, comprising:

a plurality of semiconductor manufacturing apparatus, inclusive of an exposure apparatus;

a local-area network or interconnecting said plurality of semiconductor manufacturing apparatus; and a gateway for connecting said local-area network and an external network outside said plant, said exposure apparatus including:

an illumination device for controlling an illumination distribution;

a stage for holding a substrate, driving the substrate to a predetermined position and positioning the substrate at the predetermined position; and a projection optics unit for projecting a pattern, which is illuminated by said illumination device, onto the substrate, said illumination device, which is for carrying out exposure even when a movable stage is being accelerated by acceleration in an acceleration interval or decelerated by deceleration in a deceleration interval, including:

(i) an illumination measurement unit for measuring illumination of pulsed light on a surface of a wafer mounted on the movable stage, wherein the illumination measurement unit is used to obtain a condition in order to control an illumination distribution within an illumination area in accordance with a driving pattern of the movable stage, including the acceleration interval and the deceleration interval;

(ii) an optical member for varying a phase of the illumination distribution for each pulsed light within the illumination area of an illumination unit that is for performing the exposure; and (iii) means for driving said optical member based on the obtained condition, wherein a pattern for driving said optical member is decided based upon results of measuring the illumination distribution corresponding to the driving pattern in the acceleration interval or the driving pattern in the deceleration interval of the stage.

23. A semiconductor manufacturing plant, comprising:

a plurality of semiconductor manufacturing apparatus inclusive of an exposure apparatus;

a local-area network or interconnecting said plurality of semiconductor manufacturing apparatus; and a gateway for connecting said local-area network and an external network outside said plant, said exposure apparatus comprising:

an illumination optical device for controlling an illumination distribution;

a stage for holding a substrate, driving the substrate to a predetermined position and positioning the substrate at the predetermined position; and a projection optics unit for projecting a pattern, which is illuminated by said illumination device, onto the substrate, said illumination device, which is for carrying out exposure even when a movable stage is being accelerated by acceleration in an acceleration interval or decelerated by deceleration in a deceleration interval, including:

(i) an illumination measurement unit for measuring illumination of pulsed light on a surface of a wafer mounted on the movable stage, wherein the illumination measurement unit is used to obtain a condition in order to control an illumination distribution within an illumination area in accordance with a driving pattern of the movable stage, including the acceleration interval and the deceleration interval; and (ii) illumination-distribution varying means for varying a phase of the illuminating distribution for each pulsed light within the illumination area of an illumination unit that is for performing the exposure, based on the obtained condition, wherein said illumination-distribution varying means varies the phase of the illumination distribution based on the obtained condition of a changing rate of a velocity or an angular velocity of said illumination-distribution varying means, which is less than the acceleration in the acceleration interval or the deceleration in the deceleration interval of the movable stage, and varies the phase of the illumination distribution of the illumination unit periodically.

24. A method of maintaining an exposure apparatus, said method comprising the steps of:

preparing a database, which is for storing information relating to maintenance of the exposure apparatus, on an external network outside a plant in which the exposure apparatus is installed;

connecting the exposure apparatus to a local-area network within the plant; and maintaining the exposure apparatus, based upon information that is stored in the database, utilizing the external network and the local-area network, the exposure apparatus including:

an illumination device for controlling an illumination distribution;

a stage for holding a substrate, driving the substrate to a predetermined position and positioning the substrate at the predetermined position; and a projection optics unit for projecting a pattern, which is illuminated by the illumination device, onto the substrate, the illumination device, which is for carrying out exposure even when a movable stage is being accelerated by acceleration in an acceleration interval or decelerated by deceleration in a deceleration interval, including:

(i) an illumination measurement unit for measuring illumination of pulsed light on a surface of a wafer mounted on the movable stage, wherein the illumination measurement unit is used to obtain a condition in order to control an illumination distribution within an illumination area in accordance with a driving pattern of the movable stage, including the acceleration interval and the deceleration interval; and (ii) illumination-distribution varying means for varying a phase of the illumination distribution for each pulsed light within the illumination area of an illumination unit that is for performing the exposure based on the obtained condition, wherein the illumination-distribution varying means has a function for varying the phase of the illumination distribution of each pulsed light in accordance with the acceleration in the acceleration interval, the deceleration in the deceleration interval, or a velocity in a constant velocity interval of the movable stage.

25. A method of maintaining an exposure apparatus, said method comprising the steps of:

preparing a database, which is for storing information relating to maintenance of the exposure apparatus, on an external network outside a plant in which the exposure apparatus is installed;

connecting the exposure apparatus to a local-area network within the plant; and maintaining the exposure apparatus, based upon information that is stored in the database, utilizing the external network and the local-area network, the exposure apparatus including:

an illumination device for controlling an illumination distribution;

a stage for holding a substrate, driving the substrate to a predetermined position and positioning the substrate at the predetermined position; and a projection optics unit for projecting a pattern, which is illuminated by the illumination device, onto the substrate, the illumination device, which is for carrying out exposure even when a movable stage is being accelerated by acceleration in an acceleration interval or decelerated by deceleration in a deceleration interval, including:

(i) an illumination measurement unit for measuring illumination of pulsed light on a surface of a wafer mounted on the movable stage, wherein the illumination measurement unit is used to obtain a condition in order to control an illumination distribution within an illumination area in accordance with a driving pattern of the movable stage, including the acceleration interval and the deceleration interval;

(ii) an optical member for varying a phase of the illumination distribution for each pulsed light within the illumination area of an illumination unit that is for performing the exposure; and (iii) means for driving the optical member based on the obtained condition, wherein a pattern for driving the optical member is decided based upon results of measuring the illumination distribution corresponding to the driving pattern in the acceleration interval or the driving pattern in the deceleration interval of the stage.

26. A method of maintaining an exposure apparatus, said method comprising the steps of:

preparing a database, which is for storing information relating to maintenance of the exposure apparatus, on an external network outside a plant in which the exposure apparatus is installed;

connecting the exposure apparatus to a local-area network within the plant; and maintaining the exposure apparatus, based upon information that is stored in the database, utilizing the external network and the local-area network, the exposure apparatus including:

an illumination device for controlling an illumination distribution;

a stage for holding a substrate, driving the substrate to a predetermined position and positioning the substrate at the predetermined position; and a projection optics unit for projecting a pattern, which is illuminated by the illumination device, onto the substrate, the illumination device, which is for carrying out exposure even when a movable stage is being accelerated by acceleration in an acceleration interval or decelerated by deceleration in a deceleration interval, including:

(i) an illumination measurement unit for measuring illumination of pulsed light on a surface of a wafer mounted on the movable stage, wherein the illumination measurement unit is used to obtain a condition in order to control an illumination distribution within an illumination area in accordance with a driving pattern of the movable stage, including the acceleration interval and the deceleration interval; and (ii) illumination-distribution varying means for varying a phase of the illumination distribution for each pulsed light within the illumination area of an illumination unit that is for performing the exposure, based on the obtained condition, wherein the illumination-distribution varying means varies the phase of the illumination distribution based on the obtained condition of a changing rate of a velocity or an angular velocity of the illumination-distribution varying means, which is less than the acceleration in the acceleration interval or the deceleration in the deceleration interval of the movable stage, and varies the phase of the illumination distribution of the illumination unit periodically.

27. The apparatus according to claim 6, further comprising:

an interface for being connected to a network;

a computer for running network software for communicating maintenance information for said exposure apparatus by data communication via the network; and a display for displaying the maintenance information for said exposure apparatus communicated by the network software run by said computer.

28. The apparatus according to claim 7, further comprising:
- an interface for being connected to a network;
- a computer for running network software for communicating maintenance information for said exposure apparatus by data communication via the network; and
- a display for displaying the maintenance information for said exposure apparatus communicated by the network software run by said computer.

29. The apparatus according to claim 8, further comprising:
- an interface for being connected to a network;
- a computer for running network software for communicating maintenance information for said exposure apparatus by data communication via the network; and
- a display for displaying the maintenance information for said exposure apparatus communicated by the network software run by said computer.

30. The apparatus according to claim 27, wherein said network software provides said display with a user interface for accessing a maintenance database, which is connected to an external network of a plant at which said exposure apparatus has been installed, and which is supplied by a vendor user of the exposure apparatus, thereby making it possible to obtain information from said database via said external network.

31. The apparatus according to claim 28, wherein said network software provides said display with a user interface for accessing a maintenance database, which is connected to an external network of a plant at which said exposure apparatus has been installed, and which is supplied by a vendor or user of the exposure apparatus, thereby making it possible to obtain information from said database via said external network.

32. The apparatus according to claim 29, wherein said network software provides said display with a user interface for accessing a maintenance database, which is connected to an external network of a plant at which said exposure apparatus has been installed, and which is supplied by a vendor or user of the exposure apparatus, thereby making it possible to obtain information from said database via said external network.

* * * * *

UNITED STATES PATENT AND TRADEMARK OFFICE
CERTIFICATE OF CORRECTION

PATENT NO. : 6,788,391 B2
DATED : September 7, 2004
INVENTOR(S) : Takehiko Iwanaga It is certified that error appears in the above-identified patent and that said Letters Patent is hereby corrected as shown below:

Column 5,
Line 45, "is W" should read -- W is --.

Column 9,
Line 52, "actually" should read -- actual --.

Column 10,
Line 31, "A" should read -- a --.
Line 34, "CCDS," should read -- CCDs, --.

Column 20,
Line 42, "plan" should read -- plant --.

Column 22,
Line 10, "or" should read -- for --.

Signed and Sealed this

Eleventh Day of January, 2005

JON W. DUDAS
*Director of the United States Patent and Trademark Office*